United States Patent
Miyashita et al.

(10) Patent No.: US 12,033,864 B2
(45) Date of Patent: Jul. 9, 2024

(54) SUBSTRATE PROCESSING METHOD AND SUBSTRATE PROCESSING APPARATUS

(71) Applicant: Tokyo Electron Limited, Tokyo (JP)

(72) Inventors: Hiromi Miyashita, Miyagi (JP); Rei Shoji, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 85 days.

(21) Appl. No.: 17/648,840

(22) Filed: Jan. 25, 2022

(65) Prior Publication Data

US 2022/0238348 A1 Jul. 28, 2022

(30) Foreign Application Priority Data

Jan. 28, 2021 (JP) .................... 2021-012453

(51) Int. Cl.
*H01L 21/311* (2006.01)
*H01J 37/32* (2006.01)
*H01L 21/02* (2006.01)

(52) U.S. Cl.
CPC .. *H01L 21/31116* (2013.01); *H01J 37/32449* (2013.01); *H01L 21/0206* (2013.01); *H01L 21/31144* (2013.01); *H01J 2237/334* (2013.01)

(58) Field of Classification Search
None
See application file for complete search history.

(56) References Cited

U.S. PATENT DOCUMENTS

2016/0336191 A1* 11/2016 Saitoh .................... H10B 43/50
2019/0348296 A1* 11/2019 Sherpa .............. H01J 37/32009

FOREIGN PATENT DOCUMENTS

| JP | 2006-278436 | 10/2006 |
| JP | 2016-225437 | 12/2016 |

* cited by examiner

*Primary Examiner* — Roberts P Culbert
(74) *Attorney, Agent, or Firm* — IPUSA, PLLC

(57) ABSTRACT

A substrate processing method includes providing a substrate into a chamber, the substrate including a silicon oxide film and a mask of an organic film on the silicon oxide film, etching the silicon oxide film with a first plasma generated from a first process gas, the first process gas including a fluorocarbon gas and a hydrogen-containing gas, and further etching the silicon oxide film with a second plasma generated from a second process gas, the second process gas including a fluorocarbon gas. A flow rate of the hydrogen-containing gas included in the first process gas is less than a flow rate of the fluorocarbon gas included in the first process gas.

16 Claims, 6 Drawing Sheets

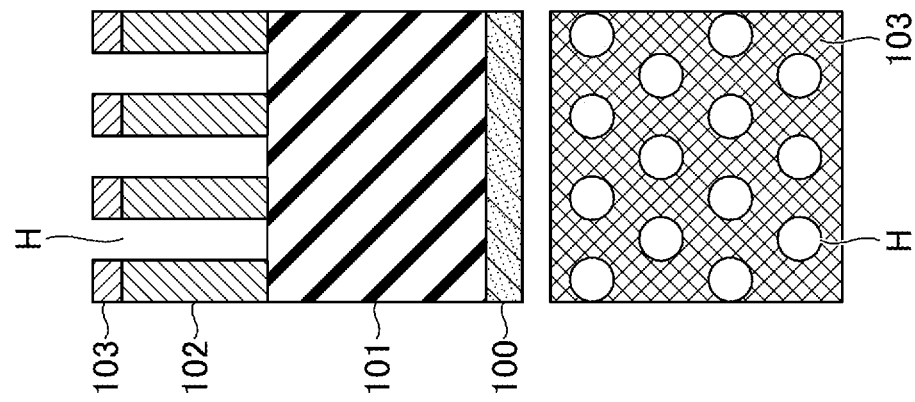
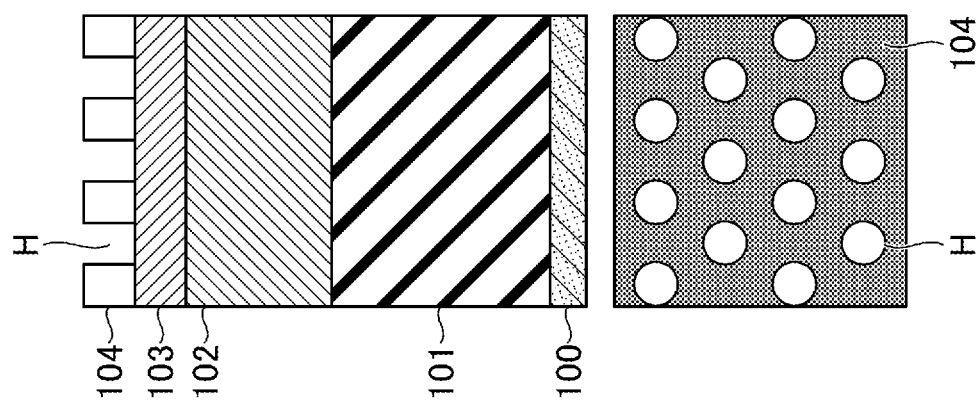

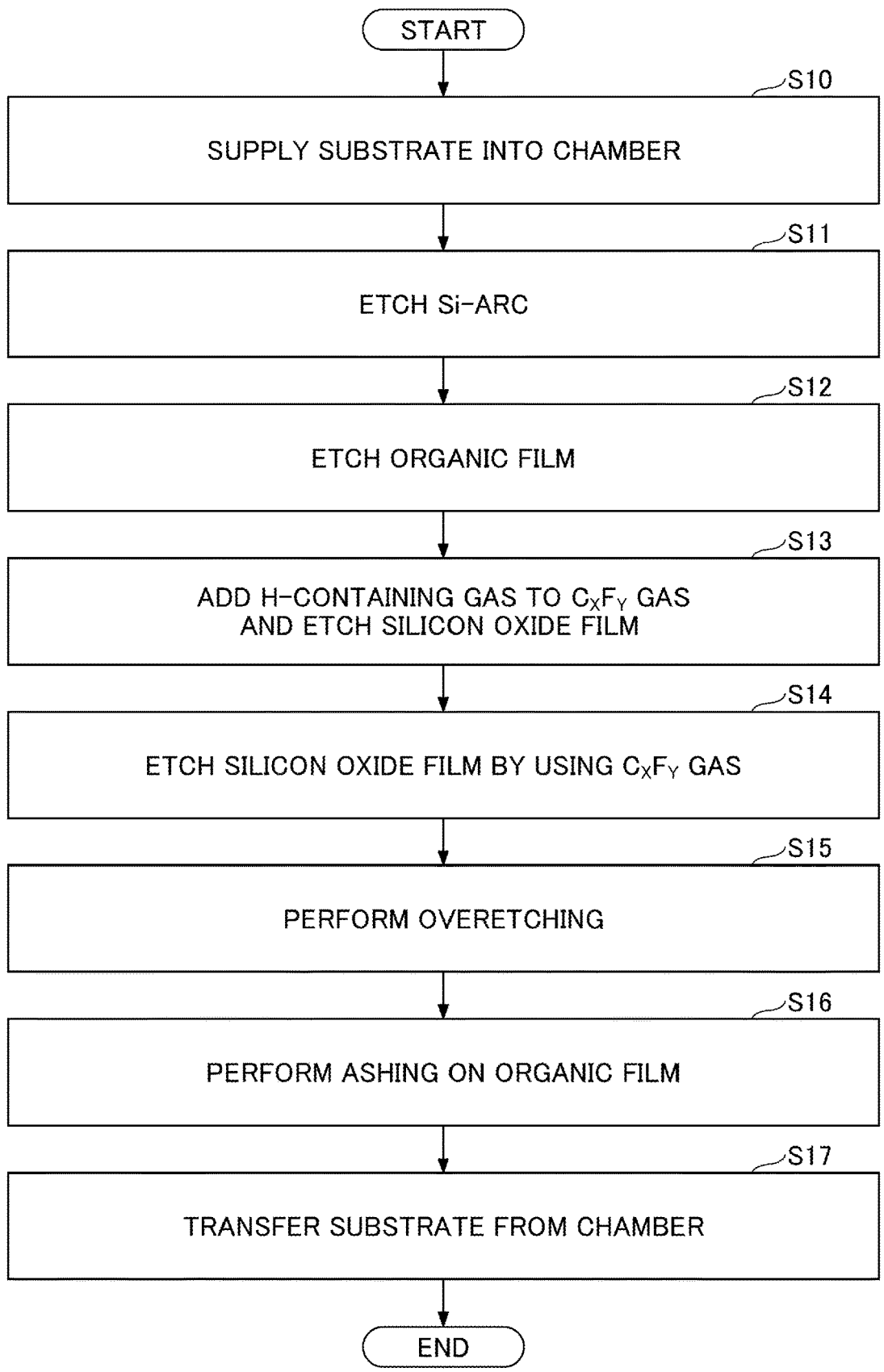

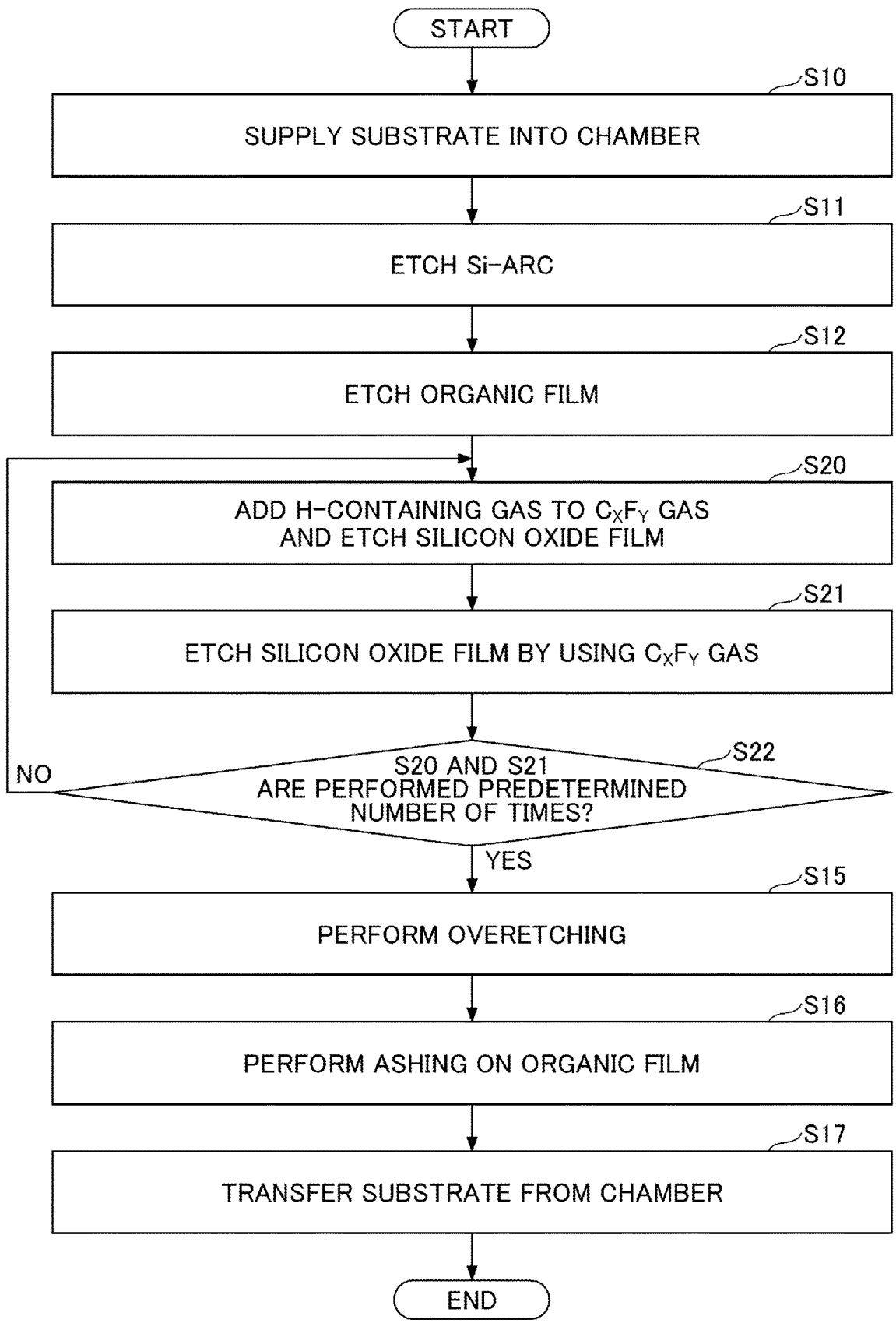

SUBSTRATE PROCESSING METHOD AND SUBSTRATE PROCESSING APPARATUS

CROSS-REFERENCE TO RELATED APPLICATIONS

This patent application is based on and claims priority to Japanese Patent Application No. 2021-012453 filed on Jan. 28, 2021, the entire contents of which are incorporated herein by reference.

TECHNICAL FIELD

The present disclosure relates to a substrate processing method and a substrate processing apparatus.

BACKGROUND

For example, Patent Document 1 proposes a plasma etching method of forming a hole in a silicon oxide film by an etching process through a mask, and using an etching gas containing a fluorocarbon gas to etch the silicon oxide film.

If the mask is distorted, a shape abnormality is caused in a lower layer when the lower layer is etched through the mask.

RELATED ART DOCUMENT

Patent Document

[Patent Document 1] Japanese Laid-open Patent Application Publication No. 2006-278436

SUMMARY

According to one aspect of the present disclosure, a substrate processing method includes providing a substrate into a chamber, the substrate including a silicon oxide film and a mask of an organic film on the silicon oxide film, etching the silicon oxide film with a first plasma generated from a first process gas, the first process gas including a fluorocarbon gas and a hydrogen-containing gas, and further etching the silicon oxide film with a second plasma generated from a second process gas, the second process gas including a fluorocarbon gas. A flow rate of the hydrogen-containing gas included in the first process gas is less than a flow rate of the fluorocarbon gas included in the first process gas.

BRIEF DESCRIPTION OF THE DRAWINGS

FIGS. 2A to 2E are diagrams illustrating examples of a film structure and a hole shape in an etching process according to the present disclosure;

FIG. 4 is a flowchart illustrating a first embodiment of a substrate processing method according to the present disclosure; and FIG. 5 is a flowchart illustrating a second embodiment of the substrate processing method according to the present disclosure.

DETAILED DESCRIPTION OF EMBODIMENTS

Figure 1:
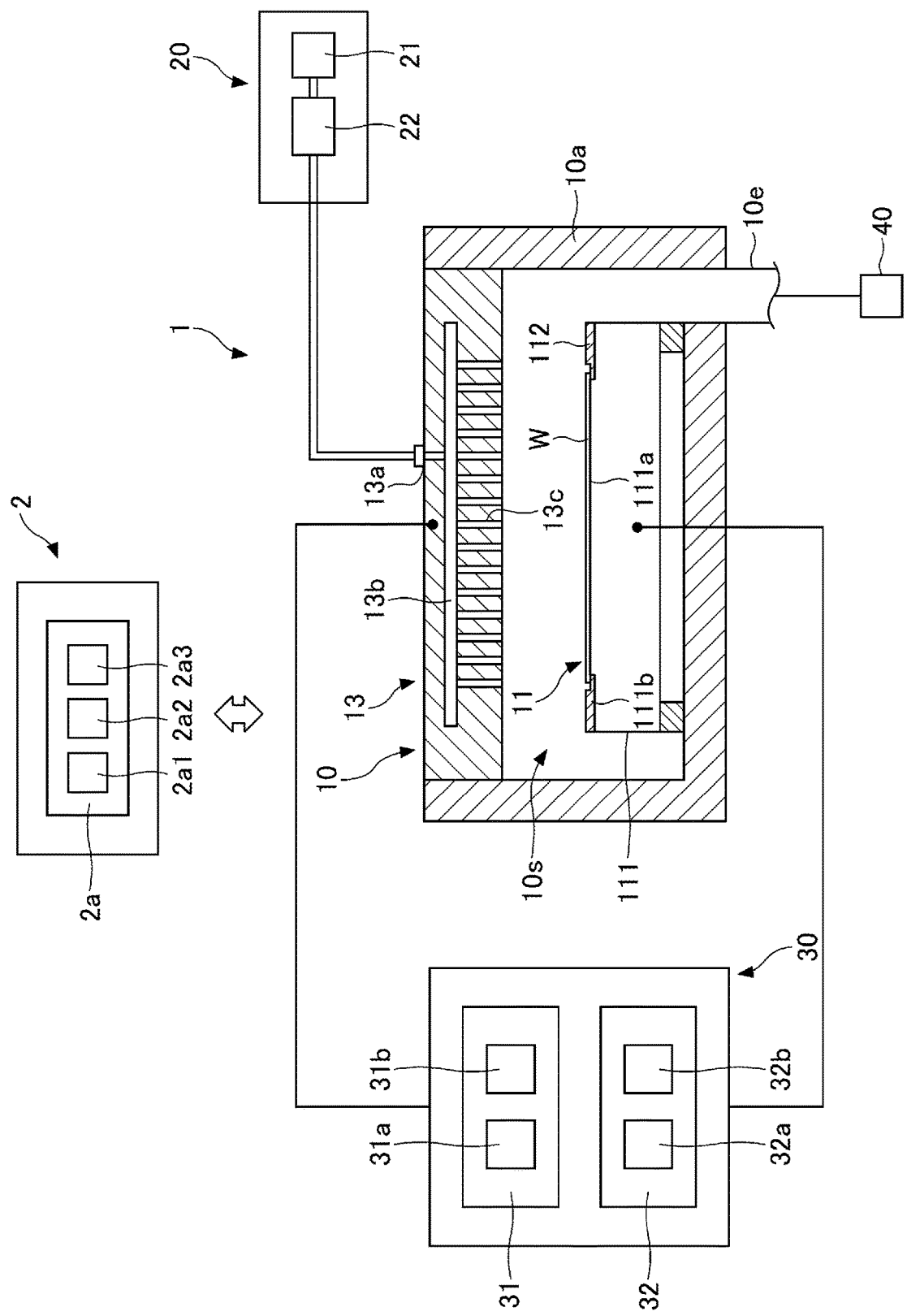
FIG. 1 is a cross-sectional diagram schematically illustrating an example of a substrate processing apparatus according to the present disclosure.

In the following, embodiments of the present disclosure will be described with reference to the drawings. In each drawing, the same components are referenced by the same reference numerals and overlapping descriptions may be omitted.

[Plasma Processing System]

In the following, a configuration example of a plasma processing system will be described with reference to FIG. 1. The plasma processing system includes a capacitively coupled plasma processing apparatus 1 and a controller 2. The plasma processing apparatus 1 is an example of a substrate processing apparatus. The capacitively coupled plasma processing apparatus 1 includes a plasma processing chamber 10, a gas supply 20, a power supply 30, and an exhaust system 40. Additionally, the plasma processing apparatus 1 includes a substrate support 11 and a gas introduction section. The gas introduction section is configured to introduce at least one process gas into the plasma processing chamber 10. The gas introduction section includes a showerhead 13. The substrate support 11 is disposed within the plasma processing chamber 10. The showerhead 13 is positioned above the substrate support 11. In the present disclosure, the showerhead 13 constitutes at least a portion of a ceiling of the plasma processing chamber 10. The plasma processing chamber 10 has a plasma processing space 10s defined by the showerhead 13, a sidewall 10a of the plasma processing chamber 10, and the substrate support 11. The plasma processing chamber includes at least one gas supply port for supplying at least one process gas to the plasma processing space 10s and at least one gas exhaust port for exhausting a gas from the plasma processing space. The sidewall 10a is grounded. The showerhead 13 and the substrate support 11 are electrically isolated from a housing of the plasma processing chamber 10.

The substrate support 11 includes a body 111 and a ring assembly 112. The body 111 has a central region (a substrate support surface) 111a for supporting a substrate (wafer) W and an annular region (a ring support surface) 111b for supporting the ring assembly 112. The annular region 111b of the body 111 surrounds the central region 111a of the body 111 in a plan view. The substrate W is disposed on the central region 111a of the body 111 and the ring assembly 112 is disposed on the annular region 111b of the body 111 to surround the substrate W on the central region 111a of the body 111. In the present disclosure, the body 111 includes a base and an electrostatic chuck. The base includes an electrically conductive member. The electrically conductive member of the base serves as a lower electrode. The electrostatic chuck is disposed on the base. The upper surface of the electrostatic chuck has the substrate support surface 111a. The ring assembly 112 includes one or more annular members. At least one of the one or more annular members is an edge ring. Additionally, although not illustrated, the substrate support 11 may include a temperature adjusting module configured to adjust at least one of the electrostatic chuck, the ring assembly 112, and the substrate to a target temperature. The temperature adjusting module may include a heater, a heat transfer medium, a flow path, or a combination thereof. A heat transfer fluid, such as brine or gas, flows through the flow path. Additionally, the substrate support 11 may include a heat transfer gas supply configured to supply a heat transfer gas between the back surface of the substrate W and the substrate support surface 111a.

The showerhead 13 is configured to introduce at least one process gas from the gas supply 20 into the plasma processing space 10s. The showerhead 13 includes at least one gas supply port 13a, at least one gas diffusion chamber 13b, and multiple gas introduction ports 13c. The process gas supplied to the gas supply port 13a is introduced into the plasma processing space 10s from multiple gas introduction ports 13c through the gas diffusion chamber 13b. Additionally, the showerhead 13 includes an electrically conductive member. The conductive member of the showerhead 13 functions as an upper electrode. Here, the gas introduction section may include, in addition to the showerhead 13, one or more side gas injectors (SGI) attached to one or more openings formed in the sidewall 10a.

The gas supply 20 may include at least one gas source 21 and at least one flow controller 22. In the present disclosure, the gas supply 20 is configured to supply at least one process gas from a corresponding gas source 21 to the showerhead 13 through a corresponding flow controller 22. Each flow controller 22 may include, for example, a mass flow controller or a pressure controlled flow controller. Further, the gas supply 20 may include one or more flow modulating devices that modulate or pulse the flow rate of the at least one process gas.

The power supply 30 includes an RF power supply 31 coupled to the plasma processing chamber through at least one impedance matching circuit. The RF power supply 31 is configured to supply at least one RF signal (RF power), such as a source RF signal and a bias RF signal, to the conductive member of the substrate support 11 and/or the conductive member of the showerhead 13. This forms plasma from the at least one process gas supplied to the plasma processing space 10s. Thus, the RF power supply 31 may function as at least a part of a plasma generator configured to generate a plasma from one or more process gases in the plasma processing chamber 10. Additionally, when the bias RF signal is supplied to the conductive member of the substrate support 11, a bias potential is generated in the substrate W, and an ion component in the formed plasma can be drawn into the substrate W.

In the present disclosure, the RF power supply 31 includes a first RF generator 31a and a second RF generator 31b. The first RF generator 31a is coupled to the conductive member of the substrate support 11 and/or the conductive member of the showerhead 13 through at least one impedance matching circuit and is configured to generate a source RF signal (source RF power) for plasma generation. In the present disclosure, the source RF signal has a frequency in the range of 13 MHz to 150 MHz. In the present disclosure, the first RF generator 31a may be configured to generate multiple source RF signals having different frequencies. The generated one or more source RF signals are supplied to the conductive member of the substrate support 11 and/or the conductive member of the showerhead 13. The second RF generator 31b is coupled to the conductive member of the substrate support 11 through at least one impedance matching circuit and is configured to generate a bias RF signal (bias RF power). In the present disclosure, the bias RF signal has a frequency lower than the frequency of the source RF signal. In the present disclosure, the bias RF signal has a frequency in the range of 400 kHz to 13.56 MHz. In the present disclosure, the second RF generator 31b may be configured to generate multiple bias RF signals having different frequencies. The generated one or more bias RF signals are supplied to the conductive member of the substrate support 11. Additionally, in various embodiments, at least one of the source RF signal and the bias RF signal may also be pulsed.

The power supply 30 may also include a DC power supply 32 coupled to the plasma processing chamber 10. The DC power supply 32 includes a first DC generator 32a and a second DC generator 32b. In the present disclosure, the first DC generator 32a is connected to the conductive member of the substrate support 11 and is configured to generate a first DC signal. The generated first bias DC signal is applied to the conductive member of the substrate support 11. In the present disclosure, the first DC signal may be applied to another electrode, such as an electrode in the electrostatic chuck. In the present disclosure, the second DC generator 32b is connected to the conductive member of the showerhead 13 and is configured to generate a second DC signal. The generated second DC signal is applied to the conductive member of the showerhead 13. In various embodiments, at least one of the first and second DC signals may be pulsed. Here, the first and second DC generators 32a and 32b may be provided in addition to the RF power supply 31, and the first DC generator 32a may be provided instead of the second RF generator 31b.

The exhaust system 40 may be connected to a gas exhaust port 10e provided at the bottom of the plasma processing chamber 10, for example. The exhaust system 40 may include a pressure regulating valve and a vacuum pump. The pressure regulating valve regulates the pressure in the plasma processing space 10s. The vacuum pump may include a turbomolecular pump, a dry pump, or a combination thereof.

The controller 2 executes computer-executable instructions that cause the substrate processing apparatus, for example, the plasma processing apparatus 1 to perform various steps described in the present disclosure. The controller 2 may be configured to control each element of the substrate processing apparatus to perform the various steps described herein. In the present disclosure, a portion or all of the controller 2 may be included in the substrate processing apparatus. The controller 2 may include, for example, a computer 2a. The computer 2a may include, for example, a processor (CPU: central processing unit) 2a1, a storage unit 2a2, and a communication interface 2a3. The processor 2a1 may be configured to perform various control operations based on a program stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the substrate processing apparatus through a communication line such as a local area network (LAN).

[Etching Step and a Hole Shape]

Next, an etching step performed in a substrate processing method according to the present disclosure will be described with reference to FIGS. 2A to 2E. FIGS. 2A to 2E are diagrams illustrating a film structure subjected to the etching step according to the present disclosure and examples of an etching shape formed by the etching step. The substrate processing method including the etching step according to the present disclosure is performed in the substrate processing apparatus, for example, the plasma processing apparatus 1. Here, although a case in which a hole H is formed by the etching step is described below, the etching shape is not limited thereto. The etching step in the present disclosure is also applicable to forming trenches, for example.

Figure 2E:
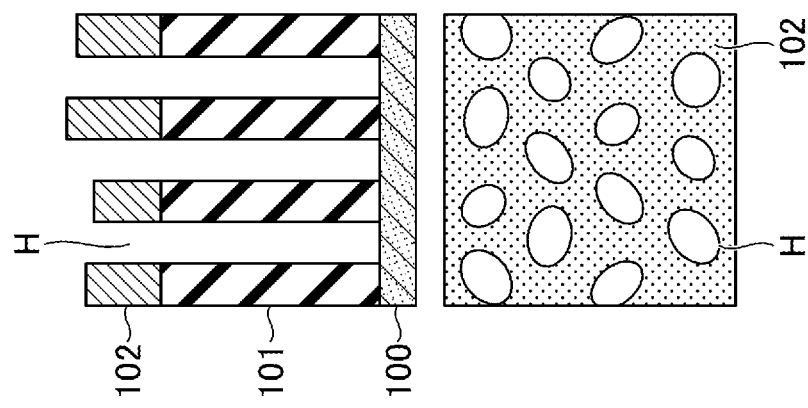

An example of an initial film structure before etching is illustrated in the upper part of FIG. 2A. On the substrate W, a polysilicon film 100, a silicon oxide film 101, an organic film 102, a silicon-containing anti-reflective coating (Si-ARC) 103, and a resist film 104 are laminated in the order from the bottom. The upper part of FIGS. 2B to 2E illustrates examples of the film structure during etching and at the completion of etching.

The lower part of FIGS. 2A to 2E illustrates a pattern of the hole H when the film structure is viewed in a plan view. The lower part of FIG. 2A illustrates the pattern of the hole H when the initial film structure is viewed in a plan view. The pattern of the substantially circular hole H is formed in the resist film 104 and the Si-ARC 103 is exposed at the bottom of the hole H.

The Si-ARC 103 is etched by using the resist film 104 as a mask for the substrate W having the above-described film structure. The etching step is performed until the organic film 102 is exposed. Next, the organic film 102 is etched by using the Si-ARC 103 as a mask. This etching step is performed until the silicon oxide film 101 is exposed.

FIG. 2B illustrates a film structure when the organic film 102 is etched until the silicon oxide film 101 is exposed and the hole H when the film structure is viewed in a plan view. In the organic film 102, substantially circular holes H are formed at equal intervals.

Next, the silicon oxide film 101 is etched by using the organic film 102 as a mask. This etching step is performed until the polysilicon film 100 is exposed.

Figure 2D:
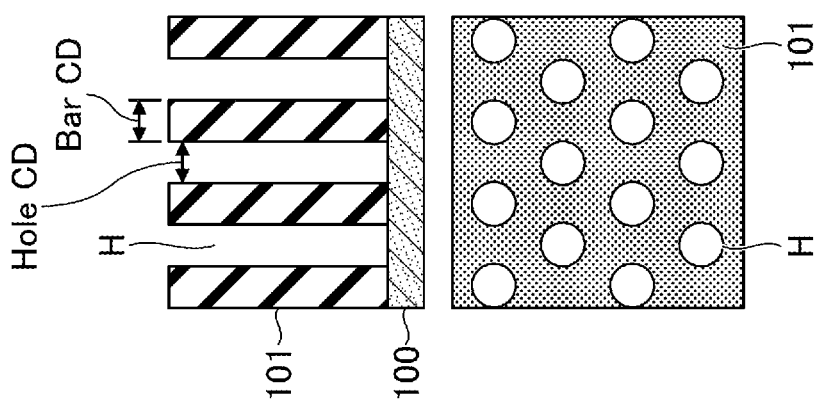
Figure 2C:
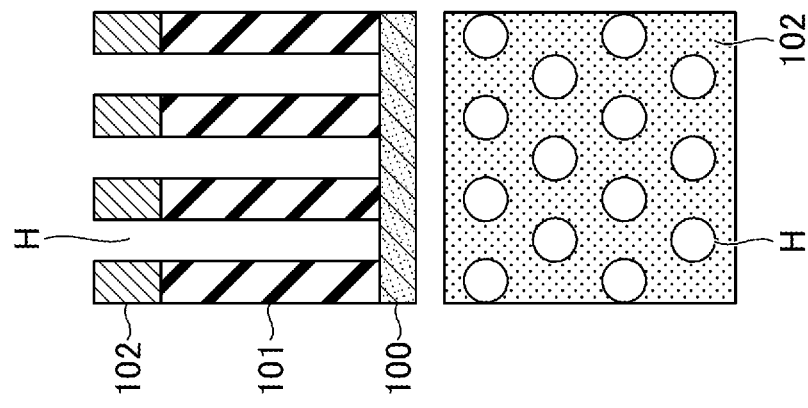

FIG. 2C illustrates a film structure when the silicon oxide film 101 is etched until the polysilicon film 100 is exposed and the hole H when the film structure is viewed in a plan view. When the organic film 102 is not distorted and substantially circular holes H are formed in the organic film 102 at equal intervals, substantially circular holes H are formed at equal intervals in the silicon oxide film 101 that is etched through the organic film 102 as illustrated in the lower part of FIG. 2C.

After the etching step is performed, the organic film 102 on the silicon oxide film 101 is removed by ashing. FIG. 2D illustrates the film structure after the ashing is performed and the hole H when the film structure is viewed in a plan view. As illustrated in the lower part of FIG. 2D, substantially circular holes H are formed in the silicon oxide film 101 at equal intervals.

However, as illustrated in FIG. 2E, if the size or shape of the organic film 102 is abnormal and the organic film 102 is distorted, a shape abnormality is caused in the silicon oxide film 101 that is etched by using the organic film 102 as a mask. That is, the variation in the sizes and shapes of the holes H formed on the silicon oxide film 101, and the variation of the distances between adjacent holes H are caused.

To etch the silicon oxide film 101, a fluorocarbon gas such as a $C_4F_8$ gas or a $C_4F_6$ gas (hereinafter referred to as a "$C_xF_y$ gas") is used. The organic film 102 is damaged while etching the silicon oxide film 101 with the $C_xF_y$ gas. As a result, the organic film 102 is scraped, the selectivity of the organic film 102 with respect to the silicon oxide film 101 (hereinafter, also referred to as the "mask selectivity") becomes insufficient, and the organic film 102 is distorted.

When the silicon oxide film 101 is etched by using the distorted organic film 102 as a mask, as illustrated in FIG. 2E, a shape abnormality is caused in the hole H formed on the silicon oxide film 101.

With respect to the above, it is conceivable that a gas species, such as a $C_xF_y$ gas and a hydrofluorocarbon gas (hereafter referred to as a "$CH_zF_y$ gas"), is optimized to improve the mask selectivity, or a protective film is formed on the mask. However, this approach may cause a problem in which the hole H of the mask of the organic film 102 is covered.

Thus, in the etching step included in the substrate processing method according to the present disclosure, in order to improve the shape of the organic film 102, a hydrogen (H)-containing gas is added to the $C_xF_y$ gas and the silicon oxide film 101 is etched. Specifically, the etching of the silicon oxide film 101 is divided into two steps, and in a first etching step, a first process gas including the $C_xF_y$ gas and the H-containing gas is supplied into the plasma processing chamber 10. The plasma is then generated from the first process gas to etch the silicon oxide film 101. In the first etching step, the flow rate of the H-containing gas contained in the first process gas is less than the flow rate of the $C_xF_y$ gas.

In a second etching step after performing the first etching step, a second process gas including the $C_xF_y$ gas is supplied into the plasma processing chamber 10. The plasma is then generated from the second process gas to further etch the silicon oxide film 101 and etch until the polysilicon film 100 is exposed.

Figure 3:
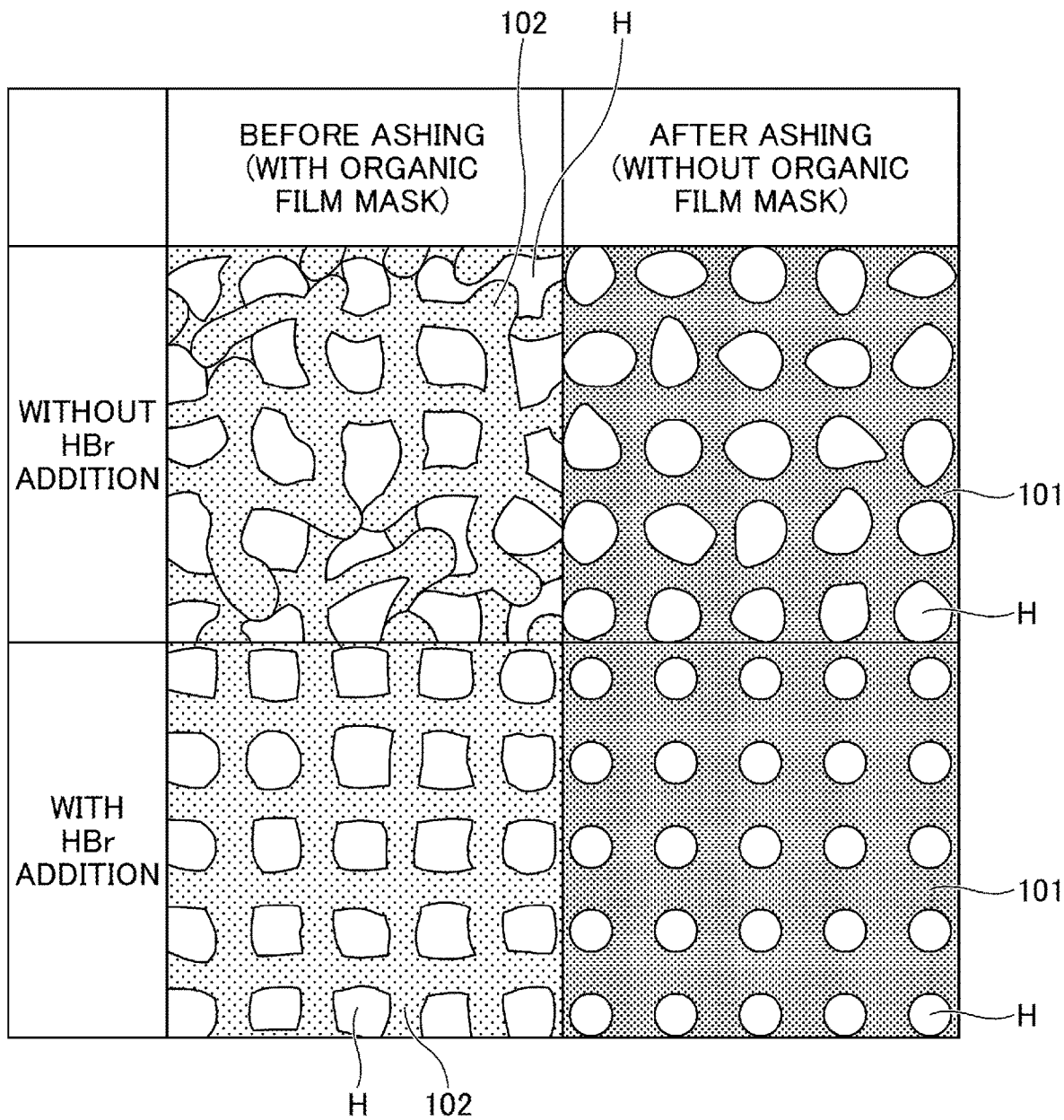
FIG. 3 is a diagram illustrating an example of the shape with or without a HBr gas addition according to the present disclosure.

FIG. 3 is a diagram illustrating an example of an effect obtained when a hydrogen bromide gas (HBr) is added as the H-containing gas in the first etching step.

The upper part of FIG. 3 illustrates an example of etching results of a comparative example (without HBr gas addition). In the comparative example, the HBr gas is not added to the $C_xF_y$ gas in the first etching step. The second etching step of the comparative example has the same etching condition as the second etching step of the present embodiment. That is, in the comparative example, in the first etching step and the second etching step, the $C_4F_8$ gas, the $C_4F_6$ gas, the argon (Ar) gas, and the oxygen (02) gas are supplied, and the silicon oxide film 101 is etched using the organic film 102 as a mask with a plasma generated from these gases.

As a result, as illustrated in the upper left side of FIG. 3, after the silicon oxide film 101 is etched, the organic film 102 before ashing is damaged and distorted by the $C_xF_y$ gas during etching of the silicon oxide film 101, and it is found that variation of the sizes and shapes of the holes H is caused. As a result, in the upper right side of FIG. 3, after the ashing of the organic film 102, a shape abnormality is caused in the hole H of the silicon oxide film 101, and the variation of the sizes and shapes of the holes H and the variation of the distances between adjacent holes H become great.

With respect to the above, in the present embodiment, in the first etching step, the $C_4F_8$ gas, the $C_4F_6$ gas, the Ar gas, the $O_2$ gas, and the HBr gas are supplied as an example of the first process gas, and the silicon oxide film 101 is partially etched using the organic film 102 as a mask with a plasma of these gases. In the second etching step, the $C_4F_8$ gas, the $C_4F_6$ gas, the Ar gas, and the $O_2$ gas are supplied as an example of the second processing gas, and the silicon oxide film 101 is etched using the organic film 102 as a mask until the polysilicon film 100 is exposed with a plasma of these gases.

As a result, as illustrated in the lower left side of FIG. 3, after the etching of the silicon oxide film 101, the organic film 102 before ashing is protected by the action of the HBr gas, damage during etching can be suppressed, and the organic film 102 is not appreciably distorted. Thus, in the lower right side of FIG. 3, after the ashing of the organic film 102, a shape abnormality of the hole H of the silicon oxide film 101 is improved, and substantially circular holes H are formed in the silicon oxide film 101 at equal intervals.

Here, as illustrated in FIG. 2D, the critical dimension (CD) of the hole H at the top of the silicon oxide film 101 after the organic film 102 is removed by the ashing is hereinafter referred to as the "Hole CD". The distance between the adjacent holes H at the top of the silicon oxide film 101 after the organic film 102 is removed by the ashing is hereinafter referred to as the "Bar CD".

[Gas Species]

In the above-described example, the $C_4F_8$ gas, the $C_4F_6$ gas, the Ar gas, the $O_2$ gas, and the HBr gas are supplied as the first process gas. However, the first process gas is only required to include at least the $C_xF_y$ gas and the H-containing gas. The $C_xF_y$ gas may be at least either the $C_4F_8$ gas or the $C_4F_6$ gas and may be another $C_xF_y$ gas. The $C_xF_y$ gas contributes primarily to the etching of the silicon oxide film 101.

The HBr gas is an example of the H-containing gas, but the H-containing gas is not limited thereto. The H-containing gas may be at least one of hydrogen ($H_2$) gas, a gas containing H and bromine (Br), a gas containing H and carbon (C), a gas containing H, C, and fluorine (F), and a gas containing H and chlorine (Cl). The gas containing H and Br may be a mixture of the $H_2$ gas and the $Br_2$ gas, in addition to the HBr gas described above.

Examples of the gas containing H and C include a $CH_4$ gas, examples of the gas containing H, C, and F include a $CH_3F$ gas, and examples of the gas containing H and Cl include an HCl gas. The gas containing H contributes primarily to the protection and shape improvement of the mask of the organic film 102.

In the substrate processing method described above, the $C_4F_8$ gas, the $C_4F_6$ gas, the Ar gas, and the $O_2$ gas are supplied as the second process gas. However, the second process gas is only required to include at least the $C_xF_y$ gas. The $C_xF_y$ gas may be at least either the $C_4F_8$ gas or the $C_4F_6$ gas and may be another $C_xF_y$ gas. Additionally, the $C_xF_y$ gas of the second process gas may be the same as the $C_xF_y$ gas of the first process gas or may be a different $C_xF_y$ gas.

As described above, the first process gas and the second process gas may further include the Ar gas and/or the $O_2$ gas. The Ar gas is an example of a dilution gas and contributes to the ignition of plasma and the like. An inert gas, such as an He gas, $N_2$ gas, or the like may be supplied instead of the Ar gas.

Additionally, the $O_2$ gas is an example of the oxygen (O)-containing gas and contributes primarily to removal of reaction products adhered to the mask of the organic film 102 and the like and is used to avoid coverage of the mask and the like. As the O-containing gas, a CO gas or a $CO_2$ gas may be used in addition to the $O_2$ gas.

Here, the second process gas may include the H-containing gas, as in the first process gas. When the second process gas includes the H-containing gas, the ratio of the flow rate of the H-containing gas to the flow rate of the $C_xF_y$ gas in the second process gas (the flow rate ratio) may be less than the ratio of the flow rate of the H-containing gas to the flow rate of the $C_xF_y$ gas in the first process gas. Additionally, the O-containing gas may be added to the second process gas in accordance with the flow rate of the H-containing gas. When both the first process gas and the second process gas include the H-containing gas and the O-containing gas, the ratio of the H-containing gas to the O-containing gas in the second process gas may be greater than the ratio of the H-containing gas to the O-containing gas in the first process gas. As described, by adjusting the ratio of the flow rate of the H-containing gas or the H-containing gas and the O-containing gas in the second process gas, coverage of the hole H accompanied with the addition of the H-containing gas can be suppressed.

[Time of the First Etching and Time of the Second Etching]

The time of the first etching and the time of the second etching are suitably adjusted according to etching conditions, such as the depth (or the aspect ratio) of the hole H to be formed in the silicon oxide film 101 and the magnitude of the RF power. In one example, the ratio of the time of the first etching step to the total time of the first etching step and the second etching step is set to be in the range from 0.4 to 0.8 or from 0.5 to 0.8. If the ratio of the time of the first etching step is large, coverage of the hole H accompanied with the addition of the H-containing gas is likely to occur. In such a case, the flow rate of the O-containing gas may be adjusted to suppress coverage of the hole H.

[Substrate Processing Method]

First Embodiment

Next, a substrate processing method according to a first embodiment of the present disclosure will be described with reference to FIG. 4. FIG. 4 is a flowchart illustrating the substrate processing method according to the first embodiment of the present disclosure. The substrate processing method according to the first embodiment is controlled by the controller 2.

When the process is started, first, the substrate W having the film structure illustrated in FIG. 2A, in which the silicon oxide film 101 and the mask of the organic film 102 are included, is supplied in the plasma processing chamber 10 (step S10). Next, the Si-ARC 103 is etched by using the resist film 104 as a mask until the organic film 102 is exposed (step S11). Next, the organic film 102 is etched by using the Si-ARC 103 as a mask until the silicon oxide film 101 is exposed (step S12).

Next, the silicon oxide film 101 is partially etched with a plasma generated from the first process gas in which the H-containing gas is added to the $C_xF_y$ gas (step S13: the first etching step). In the first etching step, the flow rate of the H-containing gas included in the first processing gas is controlled to be less than the flow rate of the $C_xF_y$ gas.

Next, the silicon oxide film 101 is etched with the $C_xF_y$ gas until the polysilicon film 100 is exposed (step S14: the second etching step). Next, the polysilicon film 100 is overetched with the $C_xF_y$ gas to remove residue at the bottom of the silicon oxide film 101 (step S15). Here, the overetching process performed in step S15 is a process of forming a certain recess on the surface of the polysilicon film 100 by overetching and preventing residue of the silicon oxide film 101 from remaining on the exposed polysilicon film 100. The overetching process may be omitted.

Next, the organic film 102 is removed by asking (step S16), the substrate W is transferred from the plasma processing chamber 10 (step S17), and the process ends.

Second Embodiment

Next, a substrate processing method according to a second embodiment of the present disclosure will be described with reference to FIG. 5. FIG. 5 is a flowchart illustrating the substrate processing method according to the second embodiment of the present disclosure. The substrate processing method according to the second embodiment is controlled by the controller 2. Steps the same as the steps of the substrate processing method of the first embodiment illustrated in FIG. 4 are referenced by the same step numbers.

When the process is started, first, the substrate W is supplied in the plasma processing chamber 10 (step S10), the Si-ARC 103 is etched (step S11), and the organic film 102 is then etched (step S12).

Next, the H-containing gas is added to the $C_xF_y$ gas and the silicon oxide film 101 is etched for a predetermined time duration (hereinafter, referred to as a first predetermined time duration) (step S20: the first etching step). In the first etching step, the flow rate of the H-containing gas included in the first processing gas is controlled to be less than the flow rate of the $C_xF_y$ gas. Next, the silicon oxide film 101 is etched with the $C_xF_y$ gas for a predetermined time duration (hereinafter, referred to as a second predetermined time duration) (step S21: the second etching step).

Next, it is determined whether the processing of step S20 and step S21 is performed a predetermined number of times (step S22). While it is determined in step S22 that the processing is not performed the predetermined number of times, the processing of steps S20 to S22 is repeatedly performed. If it is determined in step S22 that the processing has been performed the predetermined number of times, the polysilicon film 100 is overetched with the $C_xF_y$ gas to remove residue at the bottom of the silicon oxide film 101 (step S15). The overetching process performed in step S15 may be omitted.

Next, the organic film 102 is removed by asking (step S16), the substrate W is transferred from the plasma processing chamber 10 (step S17), and the process ends. Here, in step S22, the determination of the number of repeating times is performed, but it may be determined based on whether the polysilicon film 100 is sufficiently exposed, and if the polysilicon film 100 is sufficiently exposed, the process may proceed to step S15.

In the substrate processing method according to the first embodiment and the second embodiment described above, the H-containing gas is added to the $C_xF_y$ gas in the first etching step, so that the organic film 102 can be protected, thereby improving the shape of the organic film 102. For example, when the HBr gas is added, it is presumed that C—Br and/or Si—Br are formed as a protective film on the mask of the organic film 102. Because the protective film is formed on the organic film 102 in the first etching step, even if the silicon oxide film 101 is etched without adding the H-containing gas to the $C_xF_y$ gas in the second etching step, a shape abnormality is not caused in the organic film 102. This can improve the shape abnormality of the silicon oxide film 101. However, in the second etching step, the H-containing gas may be added to the $C_xF_y$ gas, following the first etching step.

Examples of the Substrate Processing Method

Next, examples of an etching process result of the substrate processing method according to the present disclosure will be described.

Example 1: Shape Improvement of the Organic Film by HBr Addition

First, shape improvement of the organic film 102 by the HBr gas addition will be described with reference to Example 1 of the substrate processing method according to the present disclosure. In Example 1, in the first etching step, the $C_4F_8$ gas, the $C_4F_6$ gas, the Ar gas, the $O_2$ gas, and the HBr gas are supplied as an example of the first processing gas, and the silicon oxide film 101 is etched using the organic film 102 as a mask with a plasma of these gases.

Next, in the second etching step, the $C_4F_8$ gas, the $C_4F_6$ gas, the Ar gas, and the $O_2$ gas are supplied as an example of the second processing gas, and the silicon oxide film 101 is etched using the organic film 102 as a mask with a plasma of these gases.

In the first etching step, the ratio (HBr/$C_xF_y$) of the flow rate of the HBr gas to the flow rate of the $C_xF_y$ gas (the total flow rate of the $C_4F_8$ gas and the $C_4F_6$ gas) is controlled to be ⅓, and the ratio (HBr/$O_2$) of the flow rate of the HBr gas to the flow rate of the $O_2$ gas is controlled to be ½. As a result, the variation of the Hole CD (3σ of the Hole CD) at the top of the silicon oxide film 101 after the asking of the organic film 102 is 2.4 nm, and the variation of the Bar CD (3σ of the Bar CD) is 3.1 nm. Here, 3σ of the Hole CD and 3σ of the Bar CD increase when the mask shape of the organic film 102 is distorted. With respect to the above, when the HBr gas is not added to the first process gas in the first etching step, 3σ of the Hole CD is 2.8 nm and 3σ of the Bar CD is 5.1 nm.

From the above, it is found that when the H-containing gas is added to the first process gas and the flow rate of the H-containing gas is controlled to be smaller than the flow rate of the $C_xF_y$ gas, 3σ of the Hole CD and 3σ of the Bar CD can be improved, and the distortion of the organic film 102 can be suppressed. As a result, the variation of the sizes and shapes of the holes H can be suppressed, and substantially circular holes H can be formed in the silicon oxide film 101 at equal intervals.

Example 2: HBr Addition Amount

Next, the addition amount of the HBr gas and the shape improvement of the organic film 102 will be described with reference to Example 2 of the substrate processing method according to the present disclosure. The gas species of the first process gas and the second process gas supplied in the first etching step and the second etching step are the same as the gas species described in Example 1.

In the first etching step, HBr/$C_xF_y$ is controlled to be ⅓, ⅖, and ½. Additionally, HBr/$O_2$ is controlled to be ½, ⅓, and ⅘, for respective above-described cases. The first etching step and the second etching step are performed under these conditions. As a result, 3σ of the Hole CD of the silicon oxide film 101 after etching is 2.4 nm to 2.7 nm and 3σ of the Bar CD is 3.6 nm to 4.1 nm.

As described above, when the HBr/$C_xH_y$ is controlled to be ½ or less, 3σ of the Hole CD and of the Bar CD can be improved, and distortion of the organic film 102 can be suppressed. As a result, the variation in the sizes and shapes of the holes H can be suppressed, and substantially circular holes H can be formed in the silicon oxide film 101 at equal intervals. However, when HBr/$C_xF_y$ is ½, the hole H of the organic film 102 tends to be covered. Thus, this tendency is improved by fine-adjusting the flow rate of the $O_2$ gas.

Example 3: HBr Addition Time

Next, the addition time of the HBr gas and the shape improvement of the organic film 102 will be described with reference to Example 3 of the substrate processing method according to the present disclosure. The gas species of the first process gas and the second process gas supplied in the first etching step and the second etching step are the same as the gas species described in Example 1.

In the first etching step, the flow rate of HBr/$C_xF_y$ is controlled to be ⅓, the flow rate of HBr/$O_2$ is controlled to be ½, and the time of the first etching step, i.e., the addition time of the HBr gas, is gradually increased. The first etching step and the second etching step are performed under these conditions. As a result, when the ratio of the time of the first etching step to the total etching time (the total time of the first etching step and the time of the second etching step) is in the range of 0.4 to 0.8, 3σ of the Hole CD is 2.3 nm to 2.4 nm, and 3σ of the Bar CD is 2.9 nm to 4.1 nm. From these values, it can be seen that the shape of the organic film 102 is improved. It is presumed that this is because the organic film 102 is protected by a carbon-based or silicon-based protective film during etching by the addition of the HBr gas. However, if the ratio of the time of the first etching step to the total etching time is increased, the hole H of the organic film 102 may be covered. In this case, the coverage of the hole H can be suppressed by fine-adjusting the flow rate of the $O_2$ gas.

Additionally, with respect to the substrate processing method according to the second embodiment illustrated in FIG. 5, an effect of the shape improvement of the organic film 102 is confirmed. Specifically, after the first etching step is performed, the second etching step for a time duration equal to the time duration of the first etching step is repeated four times. As a result, 3σ of the Hole CD is 2.3 nm and 3σ of the Bar CD is 3.4 nm. From these values, it is found that a shape abnormality of the organic film 102 can be suppressed in the second embodiment, and the shape of the hole H of the silicon oxide film 101 can be improved.

As described above, the substrate processing method according to the present embodiment includes the first etching step of supplying the first process gas including the fluorocarbon gas and the H-containing gas into the plasma processing chamber 10 and generating plasma from the first process gas to etch the silicon oxide film 101, and the second etching step of supplying the second process gas including the fluorocarbon gas into the plasma processing chamber 10 and generating plasma from the second process gas to further etch the silicon oxide film 101. In the first etching step, the flow rate of the H-containing gas included in the first process gas is controlled to be less than the flow rate of the fluorocarbon gas.

With this method, the mask of the organic film 102 can be protected by the carbon-based or silicon-based protective film during the etching of the silicon oxide film 101. As a result, by preventing distortion of the organic film 102, the variation in the sizes and shapes of the holes H formed on the silicon oxide film 101 can be suppressed, and the variation of the distances between adjacent holes H can be suppressed. As a result, substantially circular holes H can be formed in the silicon oxide film 101 at equal intervals.

In the embodiment described above, the silicon oxide film 101 is etched using the organic film 102 as a mask, but the embodiment is not limited thereto. A modified example of the substrate processing method according to the present embodiment is applicable to an etching step in which a gas containing H and Br is added to a gas containing C and F, and a silicon-containing film is etched through a mask of the organic film 102.

The above-described modified example of the substrate processing method according to the embodiment includes a step of supplying, into the plasma processing chamber 10, a substrate including the silicon-containing film and a mask of the organic film on the silicon-containing film, the first etching step of etching the silicon-containing film with a plasma generated from the first process gas including the gas containing C and F and the gas containing H and Br, and the second etching step of further etching the silicon-containing film with a plasma generated from the second process gas including the gas containing C and F. In the first etching step, the flow rate of the gas containing H and Br included in the first process gas is controlled to be less than the flow rate of the gas containing C and F.

The silicon-containing film may be a silicon oxide film, a silicon nitride film, or a silicon oxynitride film, and may be a laminated film containing two or more of the above. The gas containing C and F may be a fluorocarbon gas or a hydrofluorocarbon gas. The gas containing H and Br may be an HBr gas or a mixture of a $H_2$ gas and a $Br_2$ gas.

Here, in the substrate processing method according to the above-described embodiments and the modified example thereof, the aspect ratio of the shape formed on the silicon oxide film and the silicon-containing film by the first etching step and the second etching step is 5 to 20.

The substrate processing method and apparatus according to the embodiments disclosed herein are to be considered exemplary in all respects and not restrictive. The embodiments can be modified and improved in various forms without departing from the scope of the appended claims and the spirit thereof. The matters described in the above embodiments may employ another configuration to the extent consistent, and may be combined to the extent consistent.

According to one aspect, the abnormality of the film shape in the etching process can be suppressed.

The substrate processing apparatus of the present disclosure is applicable to any of the following types of devices: an atomic layer deposition (ALD) device, capacitively coupled plasma (CCP), inductively coupled plasma (ICP), a radial line slot antenna (RLSA), electron cyclotron resonance plasma (ECR), and helicon wave plasma (HWP). The substrate processing apparatus of the present disclosure may be an apparatus that processes substrates by using a plasma or an apparatus that processes substrates without a plasma.

What is claimed is:

1. A substrate processing method comprising:
   (a) providing a substrate into a chamber, the substrate including a silicon oxide film and a mask of an organic film on the silicon oxide film;
   (b) etching the silicon oxide film with a first plasma generated from a first process gas, the first process gas including a fluorocarbon gas and a hydrogen-containing gas; and
   (c) further etching the silicon oxide film with a second plasma generated from a second process gas, the second process gas including a fluorocarbon gas,
   wherein a flow rate of the hydrogen-containing gas included in the first process gas is less than a flow rate of the fluorocarbon gas included in the first process gas.

2. The substrate processing method as claimed in claim 1, wherein the flow rate of the hydrogen-containing gas included in the first process gas is less than or equal to ½ of the flow rate of the fluorocarbon gas included in the first process gas.

3. The substrate processing method as claimed in claim 1, wherein the hydrogen-containing gas is at least one gas selected from the group consisting of hydrogen gas; a gas containing hydrogen and bromine; a gas containing hydrogen and carbon; a gas containing hydrogen, carbon, and fluorine; and a gas containing hydrogen and chlorine.

4. The substrate processing method as claimed in claim 1, wherein an aspect ratio of a recess formed in the silicon oxide film is 5 to 20, the recess being formed by (b) and (c).

5. The substrate processing method as claimed in claim 1, wherein (b) and (c) are repeatedly performed.

6. The substrate processing method as claimed in claim 1, wherein a ratio of a time duration of (b) to a total time duration of (b) and (c) is 0.4 to 0.8.

7. The substrate processing method as claimed in claim 1, wherein the fluorocarbon gas includes at least one gas selected from the group consisting of a $C_4F_8$ gas and a $C_4F_6$ gas.

8. The substrate processing method as claimed in claim 1, wherein the first process gas further includes at least one gas selected from the group consisting of an inert gas and an oxygen-containing gas.

9. The substrate processing method as claimed in claim 1, wherein the second process gas further includes at least one gas selected from the group consisting of an inert gas and an oxygen-containing gas.

10. The substrate processing method as claimed in claim 1,
wherein the first process gas includes an oxygen-containing gas,
wherein the second process gas includes an oxygen-containing gas and a hydrogen-containing gas, and
wherein a ratio of the hydrogen-containing gas to the oxygen-containing gas in the second process gas is greater than a ratio of the hydrogen-containing gas to the oxygen-containing gas in the first process gas.

11. The substrate processing method as claimed in claim 10, wherein the oxygen-containing gas is at least one gas selected from the group consisting of $O_2$ gas, CO gas, and $CO_2$ gas.

12. The substrate processing method as claimed in claim 1, further comprising:
(d) removing the organic film by ashing,
wherein 3σ of Hole CD is less than or equal to 2.7 nm, the 3σ of the Hole CD indicating a variation of the Hole CD, and the Hole CD being a critical dimension of a hole at a top of the silicon oxide film after (d).

13. The substrate processing method as claimed in claim 1, further comprising:
(d) removing the organic film by ashing,
wherein 3σ of Bar CD is less than or equal to 4.1 nm, the 3σ of the Bar CD indicating a variation of the Bar CD, and the Bar CD being a distance between adjacent holes at a top of the silicon oxide film after (d).

14. A substrate processing method comprising:
(a) providing a substrate into a chamber, the substrate including a silicon-containing film and a mask of an organic film on the silicon-containing film;
(b) etching the silicon-containing film with a first plasma generated from a first process gas, the first process gas including a gas containing carbon and fluorine and a gas containing hydrogen and bromine; and
(c) further etching the silicon-containing film with a second plasma generated from a second process gas, the second process gas including a gas containing carbon and fluorine,
wherein a flow rate of the gas containing hydrogen and bromine included in the first process gas is less than a flow rate of the gas containing carbon and fluorine included in the first process gas.

15. The substrate processing method as claimed in claim 14,
wherein the gas containing hydrogen and bromine is a hydrogen bromide gas or a mixture of hydrogen gas and a bromine gas.

16. The substrate processing method as claimed in claim 14, wherein the silicon-containing film is a silicon oxide film, a silicon nitride film, silicon oxynitride film, or a laminated film containing two or more thereof.

\* \* \* \* \*